United States Patent
Jung (10) Patent No.: US 10,566,073 B2
(45) Date of Patent: Feb. 18, 2020

(54) TEST APPARATUS AND SEMICONDUCTOR CHIP

(71) Applicant: SK hynix Inc., Icheon-si, Gyeonggi-do (KR)

(72) Inventor: Jong Ho Jung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 42 days.

(21) Appl. No.: 15/956,148

(22) Filed: Apr. 18, 2018

(65) Prior Publication Data

US 2018/0233214 A1 Aug. 16, 2018

Related U.S. Application Data

(63) Continuation of application No. 15/173,921, filed on Jun. 6, 2016, now abandoned.

(30) Foreign Application Priority Data

Feb. 29, 2016 (KR) .................... 10-2016-0024360

(51) Int. Cl.
*G11C 29/38* (2006.01)
*G11C 29/44* (2006.01)
*G11C 29/56* (2006.01)

(52) U.S. Cl.
CPC .............. *G11C 29/38* (2013.01); *G11C 29/44* (2013.01); *G11C 29/56012* (2013.01)

(58) Field of Classification Search
CPC .... G11C 29/38; G11C 29/44; G11C 29/56012
See application file for complete search history.

(56) References Cited

U.S. PATENT DOCUMENTS 6,401,167 B1 *  6/2002  Barth ................... G11C 7/1006
                                                       365/203
6,667,926 B1    12/2003  Chen et al.
(Continued)

FOREIGN PATENT DOCUMENTS

KR    1020150040617 A    4/2015

OTHER PUBLICATIONS

Chatterjee, N., et al., "Staged Reads : Mitigating the Impact of DRAM Writes on DRAM Reads," IEEE International Symposium on High-Performance Comp Architecture, Conference Location: New Orleans, LA, USA, Date of Conference: Feb. 25-29, 2012, pp. 1-12. (Year: 2012).*

*Primary Examiner* — Kyle Vallecillo
(74) *Attorney, Agent, or Firm* — William Park & Associates Ltd.

(57) ABSTRACT

A test apparatus may be provided. The test apparatus may include a delay compensator configured to generate delayed read data by delaying read data according to a difference between an external turnaround delay value provided externally from the test apparatus and a turnaround delay detection value detected within the test apparatus. The test apparatus may include a determination circuit configured to perform a test result determination operation by comparing the delayed read data with reference data. The turnaround delay detection value may be generated by detecting a time of from a point of time when write data including a read command as the reference data is output to a point of time when the read data is received.

13 Claims, 5 Drawing Sheets (56) References Cited

U.S. PATENT DOCUMENTS

| | | |
|---|---|---|
| 7,437,527 B2 | 10/2008 | Davis et al. |
| 8,140,805 B2 | 3/2012 | Davis et al. |
| 8,301,930 B2 | 10/2012 | Morein et al. |
| 9,805,784 B2 | 10/2017 | Gopalan et al. |
| 2002/0118723 A1 | 8/2002 | McCrady et al. |
| 2006/0107001 A1* | 5/2006 | Barnum ............... G06F 13/1626 711/154 |
| 2007/0070729 A1* | 3/2007 | Huang .................... G11C 16/32 365/194 |
| 2008/0080267 A1* | 4/2008 | Lee ....................... G11C 7/1051 365/191 |
| 2010/0008167 A1* | 1/2010 | Shin ...................... G11C 7/1066 365/194 |
| 2011/0175654 A1* | 7/2011 | Lee ....................... G11C 7/1051 327/158 |
| 2011/0258475 A1 | 10/2011 | Lee et al. |
| 2011/0276762 A1* | 11/2011 | Daly .................... G06F 12/0804 711/122 |
| 2011/0276763 A1* | 11/2011 | Daly .................... G06F 12/0888 711/122 |
| 2012/0179866 A1* | 7/2012 | Davis .................. G06F 13/1626 711/105 |
| 2016/0035409 A1 | 2/2016 | Gopalan et al. |
| 2016/0173847 A1* | 6/2016 | Staudenmaier ........... H04N 5/77 |
| 2017/0097904 A1* | 4/2017 | Ware .................... G06F 13/1673 |
| 2018/0261304 A1* | 9/2018 | You ................... G11C 29/56012 |
| 2019/0266113 A1* | 8/2019 | Ware .................... G11C 7/1069 |

* cited by examiner

TEST APPARATUS AND SEMICONDUCTOR CHIP

CROSS-REFERENCES TO RELATED APPLICATION

This application is a continuation application of application Ser. No. 15/173,921 and claims priority under 35 U.S.C. 119(a) to Korean application No. 10-2016-0024360, filed on Feb. 29, 2016, in the Korean intellectual property Office, which is incorporated by reference in its entirety as set forth in full.

BACKGROUND

1. Technical Field

Various embodiments may generally relate to a semiconductor integrated circuit, and more particularly, to a test apparatus for testing a semiconductor chip.

2. Related Art

Test apparatuses for testing a data input/output (I/O) operation of a semiconductor chip, for example, a memory chip may store write data in the memory chip. As such, a determination may be made on whether the memory chip has passed or failed by comparing read data output from the memory chip according to a read command with the write data stored therein.

A delay time of from a point of time when the read command is generate to a point of time when the read data is input may refer to a turnaround delay (TAD).

An asynchronous delay component is included in the turnaround delay. The asynchronous delay may be influenced by variation in power, voltage, and temperature, and thus the turnaround delay value may be changed. Since the test apparatus may have no information for the variation of the turnaround delay, the reliability of the test operation may be degraded.

SUMMARY

According to an embodiment, a test apparatus may be provided. The test apparatus may include a delay compensator configured to generate delayed read data by delaying read data according to a difference between an external turnaround delay value provided externally from the test apparatus and a turnaround delay detection value detected within the test apparatus. The test apparatus may include a determination circuit configured to perform a test result determination operation by comparing the delayed read data with reference data. The turnaround delay detection value may be generated by detecting a time of from a point of time when write data including a read command as the reference data is output to a point of time when the read data is received.

According to an embodiment, a test apparatus may be provided. The test apparatus may include a tester configured to set a delay compensation time of read data by detecting a turnaround delay of from a first point of time when write data including a read command is output in a turnaround delay compensation mode to a second point of time when the read data received exteriorly from the test apparatus is received, generate delayed read data by delaying the read data by the delay compensation time in a normal test mode, and perform a test result determination operation by comparing the delayed read data with the write data as reference data.

According to an embodiment, a test apparatus for a semiconductor chip may be provided. The test apparatus may include a delay compensator configured to generate delayed read data by delaying read data according to a difference between an external turnaround delay value provided externally from the test apparatus and a turnaround delay detection value detected within the test apparatus. The test apparatus may include a determination circuit configured to perform a test result determination operation by comparing the delayed read data with reference data. The turnaround delay detection value may be generated by detecting a time of from a point of time when write data including a read command as the reference data is output to the semiconductor chip to a point of time when the read data is input from the semiconductor chip.

DETAILED DESCRIPTION

Hereinafter, examples of embodiments will be described below with reference to the accompanying drawings. Examples of embodiments are described herein with reference to cross-sectional illustrations that are schematic illustrations of examples of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

The concepts are described herein may be discussed with reference to cross-section and/or plan illustrations that are schematic illustrations of various embodiments. However, the embodiments should not be construed as limiting. Although a few embodiments will be illustrated and described, it will be appreciated by those of ordinary skill in the art that changes may be made in these examples of embodiments without departing from the principles and spirit of the disclosure.

One or more examples of embodiments may be provided to a test apparatus capable of compensating a turnaround delay according to a chip to be tested.

Figure 1:
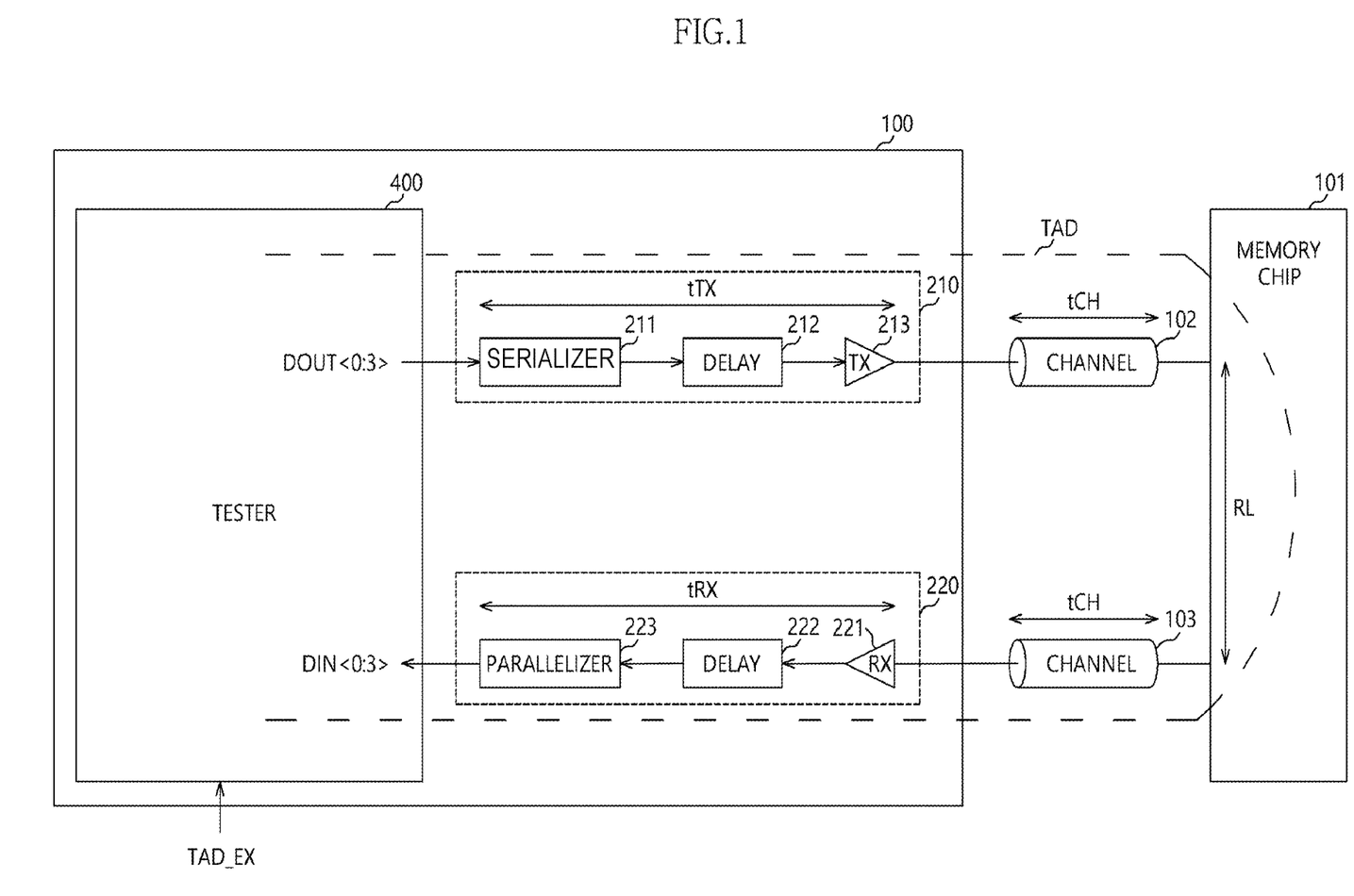
FIG. 1 is a view illustrating a representation of an example of a configuration of a test chip according to an embodiment.

Referring to FIG. 1, a test chip 100 as a test apparatus according to an embodiment may be coupled to a chip to be tested, for example, a memory chip 101 through a plurality of channels, for example, a first channel 102 and a second channel 103.

The test chip 100 may include a plurality of path circuits (for example, a first path circuit 210 and a second path circuit 220) and a tester 400.

The first path circuit 210 may transmit write data DOUT<0:3> to the memory chip 101 through the first channel 102.

An example of the write data DOUT<0:3> that a burst length is '4' is illustrated in FIG. 1.

The write data DOUT<0:3> may include a command, for example, a read command or a write command.

A corresponding bit among bits constituting the write data DOUT<0:3> may be set to a predetermined value, and thus the memory chip 101 may recognize the write data DOUT<0:3> as the command, for example, the read command or the write command.

The first path circuit 210 may include a serializer 211, a delay 212, and a transmitter (TX) 213.

The serializer 211 may serialize the write data DOUT<0:3> and output the serialized write data.

The delay 212 may delay an output of the serializer 211 by a preset time and output the delayed output of the serializer 211.

The transmitter 213 may transmit an output of the delay 212 to the first channel 102.

The second path circuit 220 may transmit the read data DIN<0:3> transmitted from the memory chip 101 to the tester 400 through the second channel 103.

The second path circuit 220 may include a receiver (RX) 221, a delay 222, and a parallelizer 223.

The receiver 221 may receive data transmitted through the second channel 103 and output the received data.

The delay 222 may delay an output of the receiver 221 by a preset time and output the delayed output of the receiver 221.

The parallelizer 223 may parallelize an output of the delay 222 and input the parallelized output of the delay 222 as the read data DIN<0:3> to the tester 400.

The tester 400 may include, for example, an algorithmic pattern generator (ALPG) (not illustrated).

The tester 400 may delay the read data DIN<0:3> according to a difference between an external turnaround delay value TAD_EX provided from the outside of the test apparatus 100 and a turnaround delay detection value generated by detecting a time of from a point of time when the write data DOUT<0:3> including the read command is output to the semiconductor chip 101 to a point of time when the read data DIN<0:3> output from the semiconductor chip 101 is input, and determine a pass or fail of the memory chip 101 by comparing the delayed read data with the write data. The semiconductor chip 101 may be realized with a memory chip 101 or include a memory chip 101.

The time of from a point of time when the write data DOUT<0:3> is output from the tester 400 to a point of time when the write data DOUT<0:3> is input to the tester 400 via the first path circuit 210, the first channel 102, the memory chip 101, the second channel 103, and the second path circuit 220 may refer to the turnaround delay TAD.

The turnaround delay TAD may be divided into a delay time tTX according to the first path circuit 210, a delay time tCH according to the first channel 102, a delay time tRX according to the second channel 103, a delay time tRX according to the second path circuit 220, and a read latency RL, which is a delay time of from a point of time when the memory chip 101 recognizes a read command RD (RD not illustrated) from the write data DOUT<0:3> to a point of time when the memory chip 101 outputs actual data, according to a component.

Figure 2:
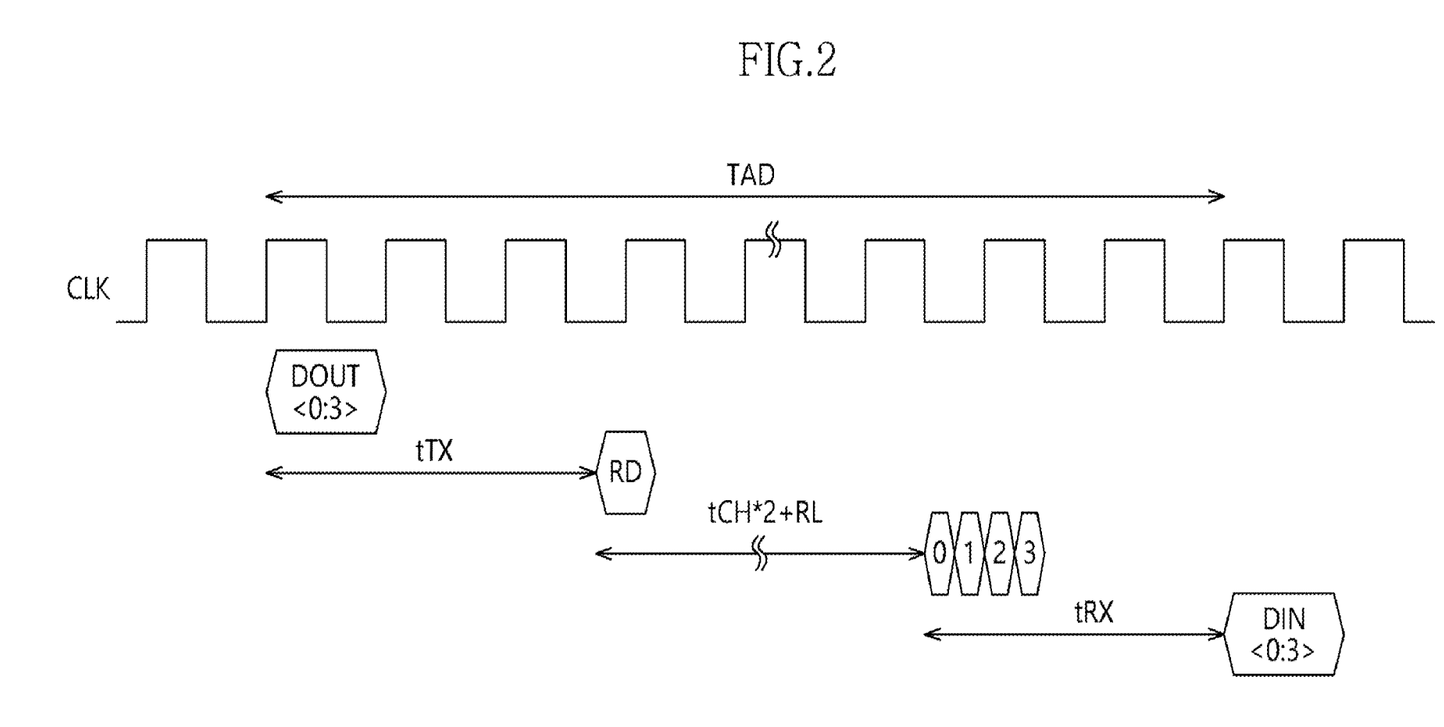
FIG. 2 is a view for explaining an example of a turnaround delay according to the test chip of FIG. 1.

Referring to FIG. 2, the turnaround delay TAD according to an embodiment may be defined as TAD=tTX+2*tCH+RL+tRX.

The tester 400 according to an embodiment may autonomously detect the turnaround delay TAD, compensate the delay time of the read data DIN<0:3> using the detected turnaround delay value as the turnaround delay detection value, and determine a pass or fail of the memory chip 101 by comparing the delayed read data with the write data.

Figure 3:
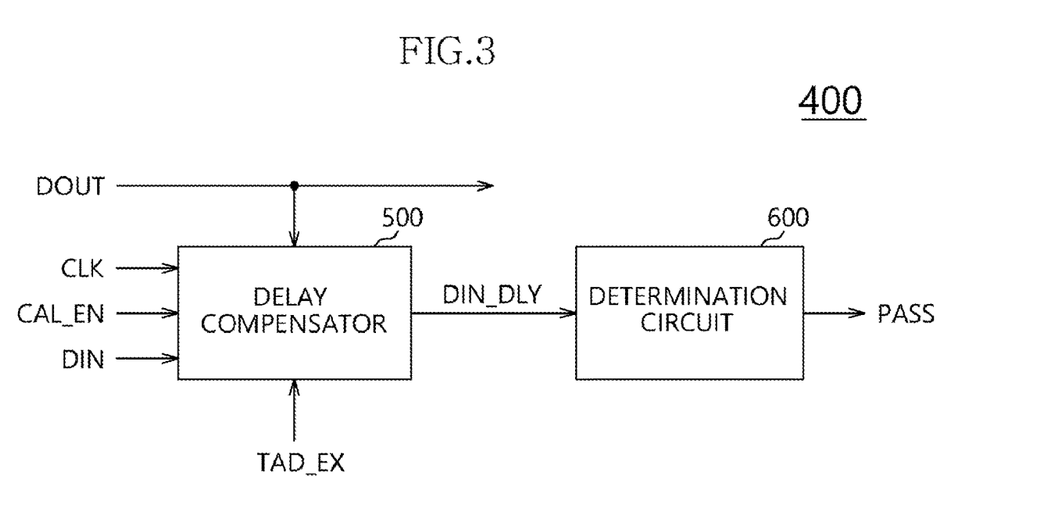
FIG. 3 is a view illustrating a representation of an example of a configuration of a tester of FIG. 1.

Referring to FIG. 3, the tester 400 may include a delay compensator 500 and a determination circuit 600.

The delay compensator 500 may generate delayed read data DIN_DLY by delaying read data DIN according to a difference between the external turnaround delay value TAD_EX and the turnaround delay detection value generated by detecting a time of from a point of time when write data DOUT including the read command RD is output to the memory chip 101 to a point of time when the read data DIN is input from the memory chip 101.

The delay compensator 500 may generate the delayed read data DIN_DLY according to a calibration enable signal CAL_EN, the write data DOUT, the read data DIN, a clock signal CLK, and the external turnaround delay value TAD_EX.

The determination circuit 600 may generate a determination signal PASS which defines pass or fail of the memory chip 101 by comparing the delayed read data DIN_DLY with the write data DOUT.

Figure 4:
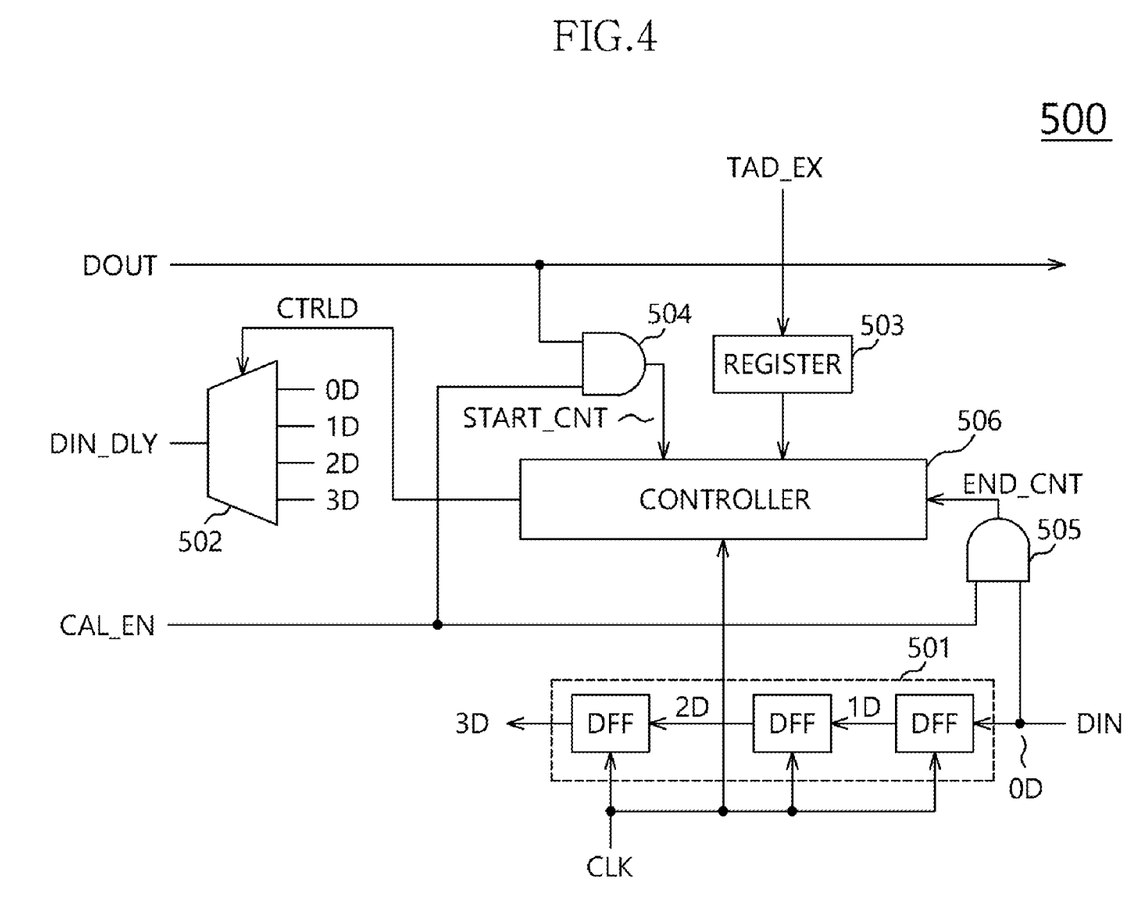
FIG. 4 is a view illustrating a representation of an example of a configuration of a delay compensator of FIG. 3.

Referring to FIG. 4, the delay compensator 500 may include a delay circuit 501, a multiplexer 502, a register 503, period signal generators 504 and 505, and a controller 506.

The delay circuit 501 may generate a plurality of delay signals 0D to 3D by delaying the read data DIN according to the clock signal CLK.

The read data DIN may be any one of DIN<0:3>.

The delay circuit 501 may include a plurality of flip flops DFF.

The plurality of flip flops DFF may generate the plurality of delay signals 0D to 3D by shifting the read data DIN or an output of a previous flip flop DFF according to the clock signal CLK.

The multiplexer 502 may select one among the plurality of delay signals 0D to 3D and output the selected delay signal as the delayed read data DIN_DLY according to a control signal CTRLD.

The register 503 may store the turnaround delay value provided from the outside of the test apparatus 100, that is, the external turnaround delay value TAD_EX.

The period signal generators 504 and 505 may generate a first period signal START_CNT and a second period signal END_CNT according to the calibration enable signal CAL_EN, the write data DOUT, and the read data DIN.

The period signal generators 504 and 505 may include a first logic gate 504 and a second logic gate 505.

The first logic gate 504 may output the first period signal START_CNT to a high level when the write data DOUT is transit to a high level in a state that the calibration enable signal CAL_EN has an activation level (that is, high level).

The second logic gate 505 may output the second period signal END_CNT to a high level when the read data DIN is transit to a high level in a state that the calibration enable signal CAL_EN has a high level.

The timing that an input terminal of the first logic gate 504 which receives the write data DOUT is transit to a high level may be an output timing of the write data DOUT.

The timing that an input terminal of the second logic gate 505 which receives the read data DIN is transit to a high level may be an input timing of the read data DIN.

The delay time of from a point of time when the first period signal START_CNT is transit to a high level to a point of time when the second period signal END_CNT is transit to a high level may refer to an actual turnaround delay TAD.

The controller 506 may detect the turnaround delay according to the first and second period signals START_CNT and END_CNT and the clock signal CLK, and generate the control signal CTRLD according to the difference between the external turnaround delay value TAD_EX and the detected turnaround delay value.

Figure 5:
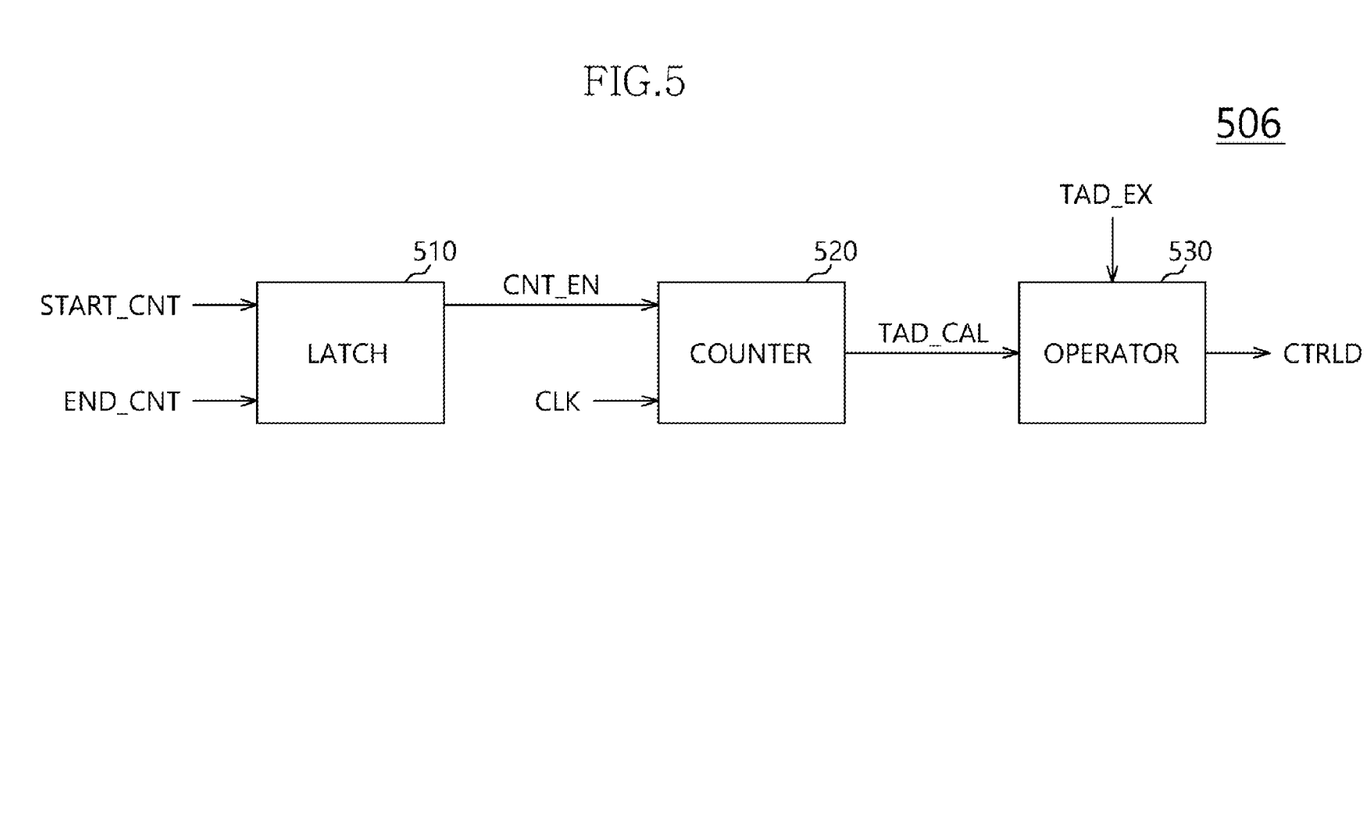
FIG. 5 is a view illustrating a representation of an example of a configuration of a controller of FIG. 4.

Referring to FIG. 5, the controller 506 may include a latch 510, a counter 520, and an operator 530.

The latch 510 may generate a counting enable signal CNT_EN according to the first and second period signals START_CNT and END_CNT.

The latch 510 may activate the counting enable signal CNT_EN according to activation of the first period signal START_CNT and inactivate the counting enable signal CNT_EN according to activation of the second period signal END_CNT.

The counter 520 may detect the turnaround delay by counting the clock signal CLK according to the counting enable signal CNT_EN.

The counter 520 may output a counting value of the clock signal CLK corresponding to an activation period of the counting enable signal CNT_EN as the turnaround delay detection value TAD_CAL.

The operator 530 may output an operation result value for a difference between the external turnaround delay value TAD_EX and the turnaround delay detection value TAD_CAL as the control signal CTRLD.

An operation of the test apparatus 100 having an above-described configuration according to an embodiment will be described.

Referring to FIG. 1, the tester 400 may perform a write operation. That is, the tester 400 may perform data write on the memory chip 101 by outputting data having a predetermined pattern together with the write command.

Referring to FIG. 4, after the write operation, the tester 400 may enter the turnaround delay compensation mode by activating the calibration enable signal CAL_EN to a high level.

The tester 400 may output the write data DOUT<0:3> including the read command RD to the memory chip 101 in the turnaround delay compensation mode.

As the write data DOUT<0:3> is output in a state that the calibration enable signal CAL_EN is a high level, that is, as a level of a predetermined bit among the bits constituting the write data DOUT<0:3> is transit to a high level, the first period signal START_CNT may be activated to a high level.

Referring to FIG. 5, as the first period signal START_CNT is transit to a high level, the counting enable signal CNT_EN may be activated.

As the counting enable signal CNT_EN is activated, the counter 520 may start to count the clock signal CLK.

Referring to FIG. 1, the memory chip 101 may output the read data DIN<0:3> by recognizing the read command RD included in the write data DOUT<0:3>.

Referring to FIG. 4, as the read data DIN<0:3> is input to the tester 400, that is, as a level of a predetermined bit among the bits constituting the read data DIN<0:3> is transit to a high level, the second period signal END_CNT may be activated to a high level.

Referring to FIG. 5, as the second period signal END_CNT is transit to a high level, the counting enable signal CNT_EN may be inactivated.

The counter 520 may output a counting value of the clock signal CLK which is a value of from a point of time when the counting enable signal CNT_EN is activated to a point of time when the counting enable signal CNT_EN is inactivated as the turnaround delay detection value TAD_CAL.

The operator 530 may perform an operation on the difference between the external turnaround delay value TAD_EX and the turnaround delay detection value TAD_CAL and output an operation result value as the control signal CTRLD.

The delay compensation time of the read data DIN<0:3> may be determined according to the control signal CTRLD.

The tester 400 may enter the normal test mode by inactivating the calibration enable signal CAL_EN to a low level when a predetermined time elapsed after the second period signal END_CNT is activated.

When the read data DIN<0:3> according to the read command RD is input in the normal test mode, the delay compensator 500 may generate the delayed read data DIN_DLY by delaying the read data DIN<0:3> by a predetermined time through the delay circuit 501 and provide the delayed read data DIN_DLY to the determination circuit 600 according to the control signal CTRLD.

The determination circuit 600 may generate the pass signal PASS which defines pass or fail of the memory chip 101 by comparing the delayed read data DIN_DLY with the write data DOUT.

The above embodiments are illustrative and not limitative. Various alternatives and equivalents are possible. The disclosure is not limited by the embodiments described herein. Nor is the disclosure limited to any specific type of semiconductor device. Other additions, subtractions, or modifications are obvious in view of the present disclosure and are intended to fall within the scope of the appended claims.

What is claimed is:

1. A test apparatus comprising:
   a first path circuit coupled to a semiconductor chip through a first channel;
   a second path circuit coupled to the semiconductor chip through a second channel; and
   a tester coupled to the first channel and the second channel,
   wherein the tester is configured to generate a turnaround delay detection value according to a read data which is output from the semiconductor chip in response to a read command, and generate delayed read data by delaying the read data according to a difference between an external turnaround delay value provided externally and the turnaround delay detection value.

2. The test apparatus of claim 1, wherein the turnaround delay detection value corresponds to a time of from a timing when the tester outputs a write data and the read command to a timing when the read data is received to the tester.

3. The test apparatus of claim 1, wherein the tester includes:
   a delay circuit configured to generate a plurality of delay signals by delaying the read data;
   a multiplexer configured to select one among the plurality of delay signals and output the selected delay signal as the delayed read data according to a control signal;

a period signal generator configured to generate a period signal according to a calibration enable signal, the write data, and the read data; and a controller configured to generate the turnaround delay detection value according to the period signal and a clock signal and generate the control signal according to the external turnaround delay value and the turnaround delay detection value.

4. The test apparatus of claim 3, wherein the delay circuit includes a plurality of flip flops configured to shift the read data or an output of a previous flip flop according to the clock signal.

5. The test apparatus of claim 3, wherein the period signal generator includes:
 a first logic gate configured to generate a first period signal according to the calibration enable signal and the write data; and
 a second logic gate configured to generate a second period signal according to the calibration enable signal and the read data.

6. The test apparatus of claim 3, wherein the controller includes:
 a latch configured to generate a counting enable signal according to the period signal;
 a counter configured to output a counting value of the clock signal as the turnaround delay detection value according to the counting enable signal; and
 an operator configured to output an operation result value for a difference between the external turnaround delay value and the turnaround delay detection value as the control signal.

7. The test apparatus of claim 3, wherein the tester further includes: a determination circuit configured to perform a test result determination operation by comparing the delayed read data with a reference data.

8. A test apparatus comprising:
 a semiconductor chip coupled to a first channel and a second channel, and output a read data in response to a read command; and
 a tester coupled to the semiconductor chip through the first channel and the second channel, configured to generate a turnaround delay detection value according to the read data and generate delayed read data by delaying the read data according to a difference between an external turnaround delay value provided externally from the test apparatus and the turnaround delay detection value,
 wherein the turnaround delay detection value corresponds to a time of from a timing when the tester outputs a write data and the read command to a timing when the read data is received to the tester.

9. The test apparatus of claim 8, wherein the tester includes:
 a delay circuit configured to generate a plurality of delay signals by delaying the read data
 a multiplexer configured to select one among the plurality of delay signals and output the selected delay signal as the delayed read data according to a control signal;
 a period signal generator configured to generate a period signal according to a calibration enable signal, the write data, and the read data; and
 a controller configured to generate the turnaround delay detection value according to the period signal and a clock signal and generate the control signal according to the external turnaround delay value and the turnaround delay detection value.

10. The test apparatus of claim 9, wherein the delay circuit includes a plurality of flip flops configured to shift the read data or an output of a previous flip flop according to the clock signal.

11. The test apparatus of claim 9, wherein the period signal generator includes:
 a first logic gate configured to generate a first period signal according to the calibration enable signal and the write data; and
 a second logic gate configured to generate a second period signal according to the calibration enable signal and the read data.

12. The test apparatus of claim 9, wherein the controller includes:
 a latch configured to generate a counting enable signal according to the period signal;
 a counter configured to output a counting value of the clock signal as the turnaround delay detection value according to the counting enable signal; and
 an operator configured to output an operation result value for a difference between the external turnaround delay value and the turnaround delay detection value as the control signal.

13. The test apparatus of claim 9, wherein the tester further includes: a determination circuit configured to perform a test result determination operation by comparing the delayed read data with a reference data.

\* \* \* \* \*